United States Patent [19]

Askin et al.

[11] Patent Number: 4,489,417
[45] Date of Patent: Dec. 18, 1984

[54] MULTI-LEVEL COMMUNICATION CIRCUITRY FOR COMMUNICATING DIGITAL SIGNALS BETWEEN INTEGRATED CIRCUITS

[75] Inventors: Haluk O. Askin, Clinton Corners; Bryant K. Ho, Hopewell Junction; Guy Rabbat, Wappingers Falls, all of N.Y.

[73] Assignee: International Business Machines Corporation, Armonk, N.Y.

[21] Appl. No.: 444,102

[22] Filed: Nov. 24, 1982

[51] Int. Cl.³ .................................... H04L 25/49
[52] U.S. Cl. .................................... 375/17; 307/270; 307/360; 307/463
[58] Field of Search .................... 375/17, 19, 20; 178/63 R, 63 A; 371/56; 307/464, 260, 261, 270, 350, 360, 363, 463

[56] References Cited

U.S. PATENT DOCUMENTS

| | | | |
|---|---|---|---|
| 3,484,559 | 7/1966 | Rigby | 179/18 |
| 3,702,473 | 11/1972 | Fink | 340/870.27 |
| 3,702,474 | 11/1972 | Fink et al. | 340/870.21 |
| 3,832,576 | 8/1974 | Proebsting | 307/279 X |
| 4,031,477 | 6/1977 | Shaw | 328/70 |
| 4,070,650 | 1/1978 | Ohashi et al. | 340/172 |
| 4,092,550 | 5/1978 | Lauffer | 307/360 |
| 4,100,429 | 7/1978 | Adachi | 307/205 |
| 4,115,706 | 9/1978 | Yamaguchi | 307/209 |
| 4,267,463 | 5/1981 | Mayumi | 307/445 |
| 4,401,899 | 8/1983 | Okada | 307/363 |
| 4,412,335 | 10/1983 | Froment | 375/36 |
| 4,417,159 | 12/1983 | Dorler | 307/270 |

OTHER PUBLICATIONS

IBM Technical Disclosure Bulletin, vol. 18, No. 9, Feb. 1976.

Primary Examiner—Benedict V. Safourek
Attorney, Agent, or Firm—Sughrue, Mion, Zinn, Macpeak & Seas

[57] ABSTRACT

A communication circuit for transmitting multi-bit digital signals from one integrated circuit to another upon a single conductor utilizing a multi-level analog signal. The transmitting circuitry includes first through third drivers, only one of which is activated at any one time. The collector of an output transistor of a first of the drivers is coupled directly to the single bus conductor, the collector of an output transistor of the second driver is coupled to the bus through a single transistor, and the collector of an output transistor of the third driver is coupled to the bus through two series-connected diodes. The receiving circuitry is composed of three receivers, each including an input and output transistor pair coupled in a Darlington configuration. The base of the input transistor of the first receiver is coupled to the bus through a single diode connected in a first direction, the second receiver coupled to the input bus through a diode in a direction opposite the first direction, and the third receiver is coupled to the input bus via two series-connected diodes, this arrangement of diodes providing three different threshold voltage levels. The outputs of the three receivers are combined to yield an output digital signal which corresponds to the input digital signal.

10 Claims, 4 Drawing Figures

MULTI-LEVEL COMMUNICATION CIRCUITRY FOR COMMUNICATING DIGITAL SIGNALS BETWEEN INTEGRATED CIRCUITS

BACKGROUND OF THE INVENTION

The invention pertains to circuits for communicating signals between integrated circuits. More specifically, the invention pertains to circuitry for communicating signals between integrated circuits in such a manner that the pin count of the integrated circuits and the number of interconnections required between integrated circuits to be interconnected are reduced.

It is known in the prior art that the number of pins needed per integrated circuit and the number of interconnections between integrated circuits can be reduced by utilizing multi-level signals instead of binary signals. In such systems, a digital signal composed of two bits, for instance, is encoded to four levels. That is, four separate and distinct voltage levels are employed on the output and input pins of the transmitting and receiving integrated circuits to represent corresponding digital values of 00, 01, 10, 11.

IBM Technical Disclosure Bulletin, Vol. 18, No. 9, February 1976, describes a multi-level bi-directional signal transmission scheme in which a digital signal is encoded and transmitted from one circuit to another using multiple current levels. In the receiving circuit described in the Technical Disclosure Bulletin, the received signal is applied to first comparison inputs of three comparator circuits, for the case of a ternary-encoded transmitted signal. The state of the signal can be detected from the outputs of the three comparators. Although some pin count and wiring reduction can be achieved with this scheme, nevertheless, the arrangement described suffers from difficulties including the necessity for tight power supply regulation, high power dissipation and circuit complexity.

U.S. Pat. No. 3,484,559 to Rigby discloses a system for communicating digital information, for instance, a dialed number, through a telephone line. The transmitting end circuitry includes a conversion device in which each item of information to be transmitted is converted into a unique combination of a number of discrete current or voltage levels. At the receiving end, the received signal is compared with a set of fixed levels to decode the digit being transmitted. FIG. 2 of that patent is an example of the transmitting end circuitry. Although perhaps suitable for transmitting digital information through a telephone exchange, the arrangement of Rigby has a number of drawbacks which make it unsuitable for use in transmitting signals between integrated circuits. First, large numbers of Zener diodes are required. It is difficult to fabricate a Zener diode in an integrated circuit with high accuracy. Secondly, high power supply voltages are required (+12 V and −50 V). Such voltages are not available in most computer or other digital processing circuitry.

Fink and Fink et al. in U.S. Pat. Nos. 3,702,473 and 3,702,474 describe a technique for monitoring information from a plurality of remote stations. At each remote station, one of seven possible resistances is connected across a transmission line. In a central station, the resistance on the transmission line is sensed to provide an indication of the resistance value connected at the remote station. Such an arrangement also is not suitable for use in transmitting signals between integrated circuits due to the complex circuitry required and the large number of resistances which must be fabricated with great accuracy.

In a patent to Proebsting, U.S. Pat. No. 3,832,576, a combination field-effect/bipolar circuit is provided to encode and transmit information from one integrated circuit to another. The input to the encoder circuit is coupled to both the gate of a field-effect transistor and the emitter of a bipolar transistor, with the outputs of the two transistors gated to provide three distinct signal levels on the output pin. This circuit is unsuitable for many integrated circuit applications in that both positive and negative supply voltages are required. Also, the impedance on the output pin changes considerably between signal levels, thereby leading to the possibility of undershoot, overshoot or ringing on the interconnecting transmission line.

The U.S. Pat. No. 4,031,477 to Shaw teaches a system for transferring logic signals between two locations in which a receiving side circuit, composed of a Zener diode and a resistor network, sets one of four voltage levels on a transmission conductor. At the receiving side, another Zener diode and resistor network converts the signal on the transmission conductor into two ternary signals which are applied to dual-threshold CMOS logic gates which activate one of four binary output signals corresponding to the signal being transmitted. This circuit is not suitable for use in transmitting signals between integrated circuits, again because of the necessity of providing Zener diodes and the requirement of resistors having accurately controlled resistance values.

Ohashi et al. in U.S. Pat. No. 4,070,650 teach a digital signal transmission system for transmitting, for instance, switch settings from a remote location to receiving and utilization circuitry through a single signal line. With reference to FIG. 5 of the drawings of that patent, a timing pulse generating circuit 6 applies pulses in sequence through resistors R11–R14 to base inputs of switching transistors Tr6–Tr9 in an encoder section E. The resistances of collector-circuit resistors R15–R17 are precisely set so that a voltage applied on line 11 is precisely determined by the value of the resistors R15–R17 and which of the switches SW1–SW4 is closed when the corresponding switching transistor Tr6–Tr9 is activated by a pulse from the timing pulse generating circuit 6. In the receiving side decoder section D, a level discriminating circuit 8 is provided which includes comparators OP1–OP4 to which the transmitted signal on the line 11 is applied. A voltage dividing network composed of resistors R19–R23 provides comparison voltages for the comparators OP1–OP4. The outputs of the comparators OP1–OP4 are coupled through diodes D7–D10 to respective inputs of a holding output circuit 9. The comparators OP1–OP4 are further connected in a cascade arrangement through a diode network composed of diodes D1–D6. In this circuit, the comparator having a set comparison value nearest to the signal value on the line 11 is activated, and the outputs from the other comparators are suspended through the cascade connections provided through the diodes D1–D6. This circuit arrangement 2 is unsuitable for use in communicating signals between integrated circuits for a number of reasons. First, the circuitry described by Ohashi et al. is quite complex and would require a large amount of chip area in order to implement. Further, as in many of the cases discussed above, precisely controlled resistance values are required.

In U.S. Pat. No. 4,100,429 to Adachi there is described a FET logic circuit in which a three-level input signal is transmitted and decoded into binary signals. As indicated in FIG. 1 of the drawings of this patent, the signal to be transmitted on a line E can have one of three states: $V_{DD}$, ground and open. A clock circuit composed of FET transistors $M_1$ and $M_2$ is also connected to the line E. When the input signal is at the $V_{DD}$ level, the voltage on the line E will also be at that level. Similarly, when the input signal is at ground, the signal on the line E will be at the ground level, independent of clocking signals applied through the FETs, $M_1$ and $M_2$. In the open state of the input signal, and only in that state, clock pulses are applied to the line E through the FETs $M_1$ and $M_2$. At the receiving end, a circuit is provided which can discriminate among levels of $V_{DD}$, ground and the pulsed state (corresponding to the input signal being in the "open" state). It is to be noted that this circuit is suitable only for three-level signals. Also, due to the necessity of detecting the pulsed state, a considerable delay is encountered from the time that the receiving circuitry is activated until it is known for certain what the state of the transmitted signal is.

Yamaguchi, in U.S. Pat. No. 4,115,706, teaches an arrangement very similar to that of the above-discussed Adachi patent in which an input signal can have only one of three possible states, "1", "float" and "0" levels. Only the implementation of the basic scheme is different.

Mayumi in U.S. Pat. No. 4,267,463 teaches a digital integrated circuit in which input/output terminals are also used as control terminals to save pin count for the integrated circuit. In a normal logical voltage range ($-0.5$ to $+5.5$ V in the case of TTL) the input/output terminals function as normal input/output terminals, but at a higher voltage region (for instance, $+8$ V for TTL), they function as control terminals. A special inverter (reference numeral 21) having a high threshold value is employed to sense when the corresponding input/output terminal is above the normal logic range and to switch the operating mode in response thereto. Although this circuit may be useful in some applications, nevertheless, it is not capable of transmitting multi-level signals, each level of which corresponds to a different binary output. Hence, the usefulness in reducing pin count in a more general context in which it is not always possible to share an input/output terminal between data and control uses is limited.

Accordingly, it is an object of the present invention to provide circuitry for transmitting data signals between integrated circuits in which the pin count for each circuit, at both transmitting and receiving ends, is reduced.

It is a further object of the present invention to provide such circuitry which requires very little chip area and which is simple to implement in integrated circuit form.

It is the yet further object of the present invention to provide such circuitry in which only a small amount of power is consumed and ground shift problems between circuits are not present.

Still further, it is an object of the invention to provide such circuitry in which no Zener diodes are required and which does not require the provision of resistors having precisely controlled resistance values.

SUMMARY OF THE INVENTION

In accordance with these and other objects of the invention, there is provided data signal communicating circuitry including a transmitting circuit and a receiving circuit connected by a single bus conductor in which signal levels on the bus conductor are set solely by power supply and ground levels, and levels determined by forward drops. The transmitting circuit includes a plurality of driver circuits having inputs connected to receive a multi-bit binary signal to be transmitted upon a single bus conductor. As determined by the states of the bits of the input multi-bit signal, only a single one of the drivers at a time can be activated. With this arrangement, the amount of power consumed is quite small, and the impedance which is connected to the bus conductor is substantially constant. At the receiving end, plural receivers, equal in number to the number of drivers, are provided, each of which has a different threshold for turning on. The threshold levels are determined, as in the case of the transmitting circuit, by diode drops. The outputs of the receivers are combined to regenerate the multi-bit signal which has been transmitted.

DESCRIPTION OF THE PREFERRED EMBODIMENT

Figure 1:
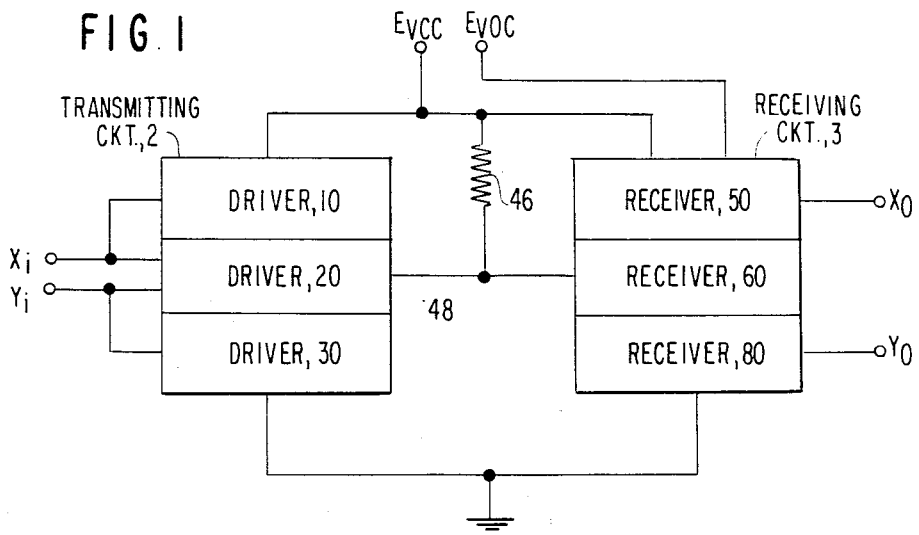
FIG. 1 is a block diagram of multi-bit signal transmitting and receiving circuitry of the invention.

Referring first to FIG. 1, there is shown therein in block diagram form a single line/multi-bit data communication circuit arrangement of the invention. The circuit arrangement includes a transmitting circuit 2 to which are inputted, in the present example, two input binary signals $X_i$, $Y_i$. The transmitting circuit 2 is composed of three drivers 10, 20 and 30. The signals $X_i$ and $Y_i$ are encoded by the drivers 10, 20 and 30 to a multi-level analog signal which is applied to the single bus conductor 48. The bus conductor 48 is pulled up to a first power supply voltage $E_{VOC}$ through a resistor 46. The other end of the bus conductor 48 is connected to the input of a receiving circuit 3 composed of three receivers 50, 60 and 80. The receiving circuit 3 decodes the multi-level analog signal on the bus conductor 48 and outputs binary signals $X_o$, $Y_o$ in response thereto which correspond to $X_i$ and $Y_i$, respectively.

The transmitting circuit 2 and the receiving circuit 3 preferably are constructed as parts of separate integrated circuits with the single bus conductor 48 connected to single terminals (I/O pads) of each of the circuits. A ground bus is connected commonly to the transmitting circuit 2 and the receiving circuit 3. Also, the transmitting circuit 2 and the receiving circuit 3 receive a common power supply voltage $E_{VCC}$, and the receiving circuit 3 further receives the power supply voltage $E_{VOC}$ which is supplied to the pull-up resistor 46.

Figure 2:
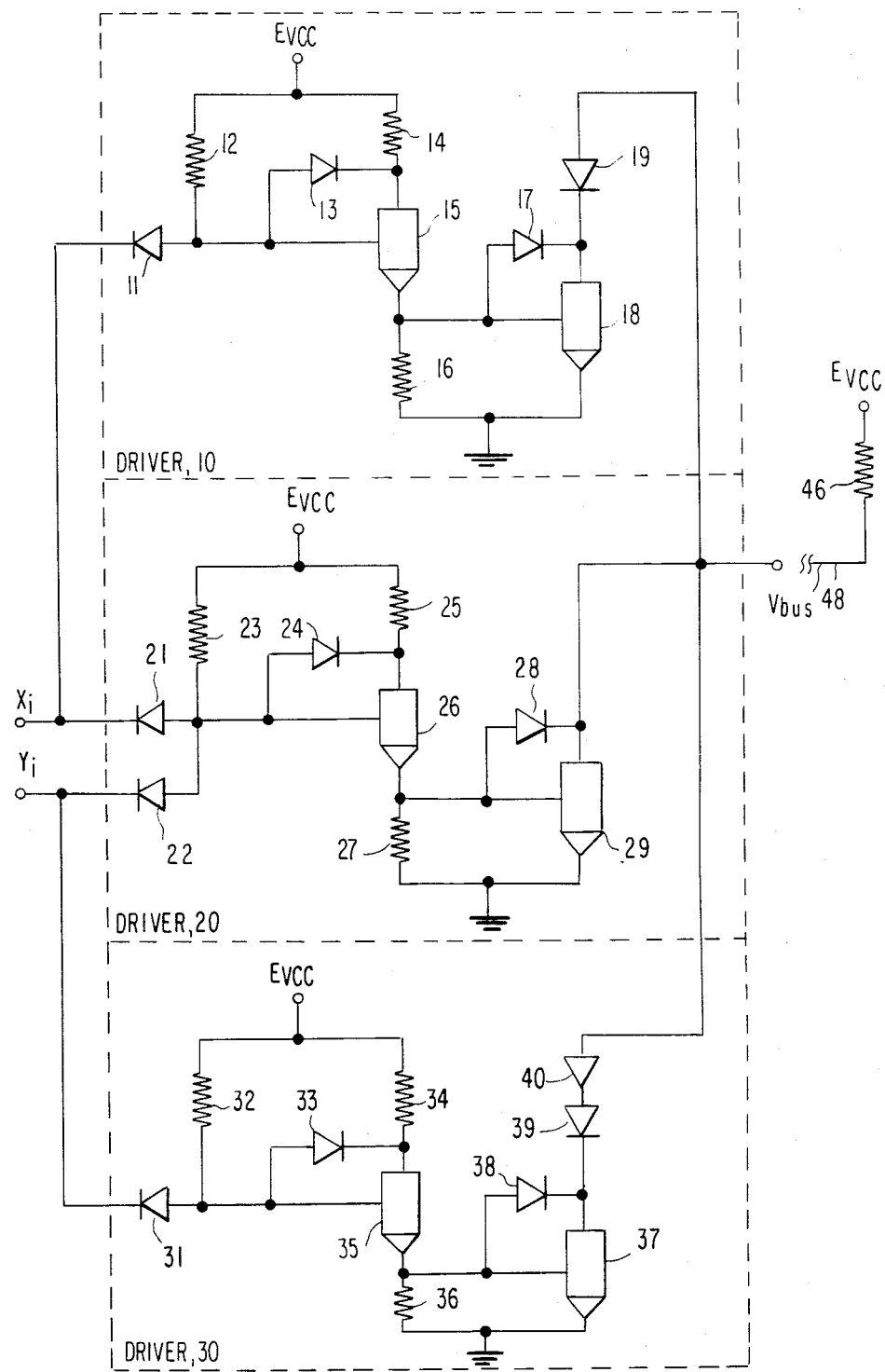
FIG. 2 is a detailed schematic diagram of the receiving side circuitry of the arrangement shown in FIG. 1.

Turning now to FIG. 2, the detailed construction of the transmitting circuit 2 will be described. The binary signal $X_i$ is applied through a diode 11 to the base of a bipolar transistor 15 which is connected in a common-emitter configuration with its collector connected through a resistor 14 to the supply voltage $E_{VCC}$ and its emitter through a resistor 16 to ground. Base bias is supplied through a resistor 12, and a diode 13 is connected in the familiar Schottky configuration to prevent the transistor 15 from going hard into saturation. The emitter of the transistor 15 is connected to the base of a second bipolar transistor 18. The transistor 18 is provided with a Schottky-connected diode 17. The collector of the transistor 18 is connected through a diode 19 to the bus conductor 48.

The drivers 20 and 30 have a similar configuration. The signal $X_i$ is coupled through a diode 21 to the base of a transistor 26 of the driver 20, with the collector of the transistor 26 being connected through a resistor 25 to the supply voltage $E_{VCC}$ and its emitter through a resistor 27 to ground. Bias current is supplied through a resistor 23, and a Schottky-connected diode 24 is provided. The emitter of the transistor 26 is coupled to the base of an output transistor 29 having a Schottky-connected diode 28. Unlike the case of the driver 20, however, the collector of the transistor 29 is connected directly to the bus conductor 48. The input signal $Y_i$ is connected through another diode 22 also to the base of the transistor 26. In the driver 30, the second input signal $Y_i$ is coupled through a diode 31 to the base of the transistor 35, the collector of which is connected through a resistor 34 to $E_{VCC}$ and the emitter through a resistor 36 to ground and to the base of a transistor 37. A Schottky diode 38 is provided for the transistor 37. The collector of the transistor 37 is coupled through series-connected diodes 39 and 40 to the bus conductor 48.

Figure 4:
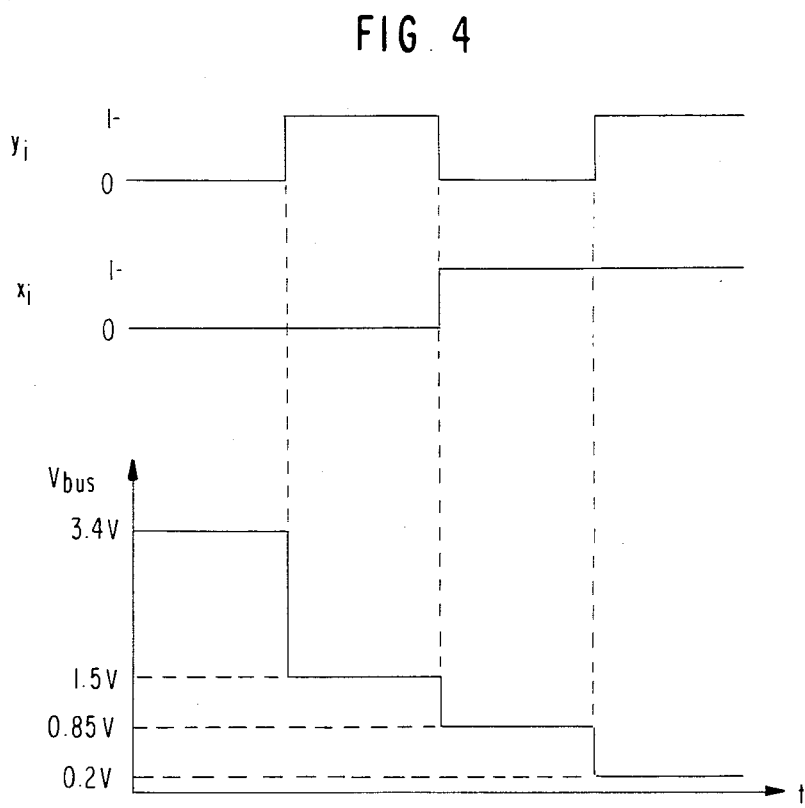
FIG. 4 is a graph showing signal levels on a single bus conductor of the circuitry of the invention.

In operation, with reference now simultaneously to FIGS. 2 and 4, when the signals $X_i$ and $Y_i$ are both in the "O" (low) state, the bias current which flows through the resistors 12, 23 and 32 is diverted through the diodes 11, 21, 22 and 31. Hence, the transistors 15, 26 and 35 are turned off, thereby also turning off the transistors 18, 29 and 37. In this case, the voltage $V_{bus}$ on the bus conductor 48 is pulled up through the resistor 46 to the power supply voltage $E_{VCC}$, which in the present example, and as shown in the graph FIG. 4, is 3.4 V. If the signal $Y_i$ is then set to the "1" (high) state while the signal $X_i$ remains in the "0" state, the bias current through the resistor 32 flows into the base of the transistor 35, turning on the transistor 35 and hence the transistor 37. The transistors 15, 18 and 26, 27 all remain off because the bias currents through the resistors 12 and 23 remain diverted through the diodes 11 and 21. The voltage $V_{bus}$ on the bus conductor 48 is then set to a voltage determined by the conducting voltage of the transistor 37 plus the forward drops of the diodes 39 and 40. Assuming that the conducting voltage $V_{ce}$ of the transistor 37 is 0.2 V and that the forward drop across each of the diodes 39 and 40 is 0.65 V, $V_{bus}$ will then be 1.5 V.

Assuming next that $X_i$ is set in the "1" state and $Y_i$ in the "0" state, the driver 10 is activated by turning on the transistor 15 with the bias current flowing through the resistor 12. The transistors 26, 29, 35 and 37 remain off because the bias currents supplied through the resistors 23 and 32 are diverted through the diodes 22 and 31. The transistor 15 turns on the output transistor 18. In this case then, the voltage $V_{bus}$ on the bus line 48 is equal to the voltage drop $V_{ce}$ across the transistor 18 plus the forward drop across the diode 19. Assuming the same values as in the case of the driver 30, $V_{bus}$ is set to 0.85 V.

Finally, assuming that both $X_i$ and $Y_i$ are in the "1" state, all of the transistors 15, 18, 26, 29, 35 and 37 are turned on. However, among the output transistors 18, 29 and 37, current only flows through the transistor 29 as its collector is connected directly to the bus conductor 48. This pulls the voltage $V_{bus}$ on the conductor 48 to the conducting voltage of the transistor 29, here assumed to be 0.2 V. No current can flow through the collector-emitter circuits of the transistors 18 and 37 because the diodes 19, 39 and 40 are then reverse biased.

From the description above, it is readily apparent that only one of the drivers 10, 20 and 30 is drawing appreciable current at any one time. Accordingly, no ground shift problem is present in this circuit arrangement.

Figure 3:
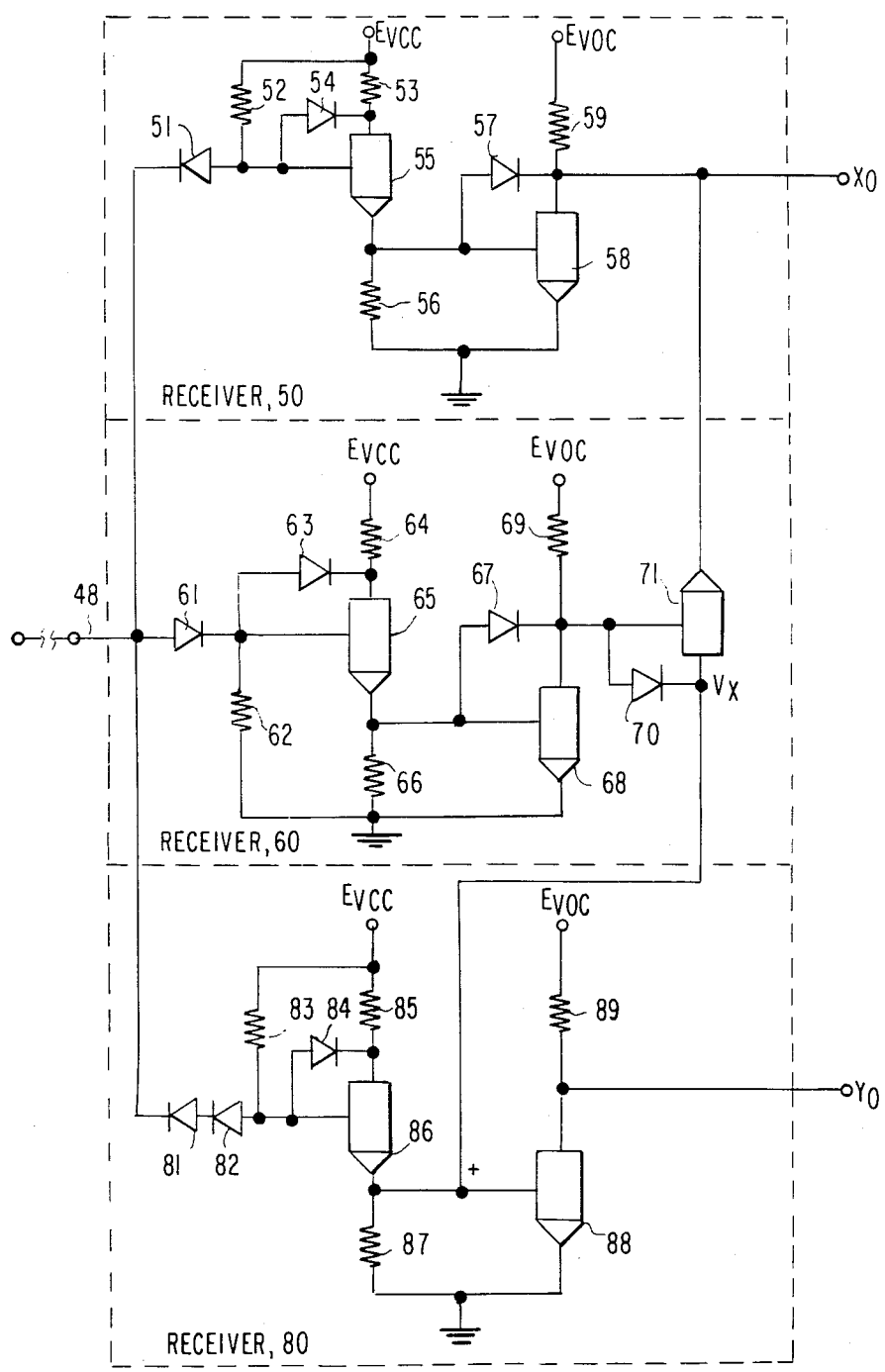
FIG. 3 is a detailed schematic diagram of the transmitting side circuitry of the arrangement shown in FIG. 1.

Referring now to FIG. 3, the detailed construction of the receiving circuit 3 will be discussed. The end of the bus conductor 48 opposite the transmitting circuit 2 is applied to inputs of each of the receivers 50, 60 and 80. In the receiver 50, the input signal $V_{bus}$ is coupled to the cathode of a low barrier diode 51, the anode of which is connected to the base of a transistor 55. The collector of the transistor 55 is connected to the voltage source $E_{VCC}$ through a resistor 53 and the emitter to ground through a resistor 56. Bias current is supplied through a resistor 52, and the transistor 55 is provided with a Schottky-connected diode 54. The emitter of the transistor 55 is connected to the base of a transistor 58, the emitter of which is connected to ground and the collector to $E_{VOC}$, which is 1.4 V in this present example, through a resistor 59. A Schottky diode 57 is connected between the collector and base of the transistor 58. In this circuit, the turn-on threshold voltage for the receiver is determined by the base-to-emitter drops ($V_{BE}$) of the transistors 55 and 58 and the forward drop across the diode 51. Assuming $V_{BE}$ drops of the transistors 55 and 58 of the 0.8 V and a forward drop $V_D$ of 0.3 V for the diode 51, the threshold voltage $V_{TH2}$ of the receiver 50 is 1.3 V.

In the receiver 60, the input from the bus conductor 48 is applied to the anode of a low barrier diode 61, the cathode of which is connected to the base of a transistor 65. The collector of the transistor 65 is coupled through a resistor 64 to the power supply voltage $E_{VCC}$ and the emitter is coupled through a resistor 66 to ground. The base of the transistor 65 is connected to ground through a resistor 62. The emitter of the transistor 65 is coupled to the base of a transistor 68, the collector of which is connected through a resistor 69 to $E_{VOC}$. Schottky-connected diodes 63 and 67 are provided for the transistors 65 and 68, respectively. The threshold voltage $V_{TH3}$ for the receiver 60, assuming that the low barrier diode and base-to-emitter drops $V_D$ and $V_{BE}$, respectively, are the same as in the case of the receiver 50, is 2 $V_{BE} + V_D = 1.9$ V.

In the receiver 80, the bus conductor 48 is coupled through series-connected high barrier diodes 81 and 82 to the base of a transistor 86, with the anode of the diode 82 being connected directly to the base of the transistor 86. The collector of the transistor 86 is connected to the power supply voltage $E_{VCC}$ through a resistor 85, and biasing current is supplied through a resistor 83. The emitter of the transistor 86 is connected to the base of a transistor 88 and to ground through a resistor 87. The emitter of the transistor 88 is grounded and the collector is coupled to $E_{VOC}$ through a resistor 89. Analyzing this circuit in the same manner as above, the threshold voltage $V_{TH1}$ of the receiver 80 is 0.4 V.

The output signal $X_o$ is formed at the collector of the transistor 58 of the receiver 50. The output signal $X_o$ is applied to the emitter of a transistor 71 of the receiver 60. The base of the transistor 71 is coupled to the collector of the transistor 68, and the collector of the transistor 71 is connected to the base of the transistor 88 in the receiver 80. The transistor 71 is provided with a Schottky-connected diode 70.

Operationally, when $(X_i, Y_i) = (1,1)$ and hence $V_{bus} = 0.2$ V, because $V_{bus} < V_{TH1} < V_{TH2} < V_{TH3}$, all of the receivers 50, 60 and 80 are disabled, that is, all of the transistors 55, 58, 65, 68, 86 and 88 are turned off. In this case, the output signals $X_o$ and $Y_o$ will be pulled to the power supply voltage $E_{VOC}$ which represents the "1" state. When $(X_i, Y_i) = (1,0)$ and hence $V_{bus} = 0.85$ V, the condition $V_{TH1} < V_{bus} < V_{TH2}$ is established. In this situation, only the receiver 80 is actuated, that is, only the transistor pair of the receiver 80 is turned on. The transistor 71 also remains off. In this situation, the output signal $Y_o$ is pulled toward ground through the transistor 88, while the signal $X_o$ remains pulled to the power supply voltage $E_{VOC}$ through the resistor 58.

Next, assuming that $(X_i, Y_i) = (0,1)$ and hence $V_{bus} = 1.5$ V, the condition $V_{TH2} < V_{bus} < V_{TH3}$ is established. In this state, the receiver 50 is actuated with the transistor 58 pulling the output signal $X_o$ toward ground. The transistor 68 of the receiver 60 remains turned off, thereby applying a positive voltage to the base of the transistor 71. Because the emitter of the transistor 71 is grounded through the transistor 58, a voltage is applied to the base of the transistor 88 determined by the sum of the collector to emitter voltages of the transistors 58 and 71. Because this voltage is less than the base-to-emitter drop $V_{BE}$ of the transistor 88, although the transistor 86 is on, the transistor 88 remains off. Hence, the output signal $Y_o$ is pulled to the power supply voltage $E_{VOC}$ through the resistor 89. Finally, when $(X_i, Y_i) = (0,0)$ and hence $V_{bus} = 3.4$ V, $V_{bus} < V_{TH3}$. In this situation, all of the receivers 50, 60 and 80 are actuated, thereby pulling both output signals $X_o$ and $Y_o$ to ground. Hence, the output signals $X_o$ and $Y_o$ follow the input signals $X_i$ and $Y_i$ at all times.

It is to be noted that all of the circuitry described above can easily be implemented using ordinary integrated circuit techniques. No Zener diodes are required. Moreover, great precision in fabricating the various resistors used in the circuit is not required. All of the critical voltages in the circuits are established using diode drops and/or transistor voltages. However, as such voltages do not vary from device to device, stringent process controls are not required during their fabrication. Moreover, the circuitry of the invention does not require large amounts of chip area. Hence, the invention provides a technique for significantly reducing the pin count of integrated circuits without appreciably increasing the costs of the circuits.

This completes the description of the preferred embodiments of the invention. Although preferred embodiments have been described, it is believed that numerous alterations and modifications thereto would be apparent to one having ordinary skill in the art without departing from the spirit and scope of the invention. Particularly, specific examples of voltage values have been given. However, these values may be varied as desired to meet the requirements of a particular application. Also, the transistors of the driver and receiver circuits have been described as being bipolar transistors. These can be implemented with FET devices if desired.

We claim:

1. A communication circuit for communicating a multi-bit digital signal between transmitting and receiving locations over a single conductor, comprising:

transmitting means at said transmitting location for producing a multi-level signal upon said conductor having a level determined in accordance with a state of an input multi-bit digital signal, said transmitting means comprising a plurality of first transistors and first diodes coupled such that the levels of said multi-level signal are determined by collector to emitter voltages of said first transistors and forward drops of said first diodes; and receiving means at said receiving location for producing an output multi-bit digital signal in response to said multi-level signal and corresponding to said input multi-bit digital signal, said receiving means comprising a plurality of second transistors and second diodes coupled to detect said multi-level signal in accordance with a plurality of threshold levels, said threshold levels being determined by threshold voltage levels of said second transistors and forward drops of said second diodes.

2. The communication circuit of claim 1, wherein said transmitting means comprises a plurality of drivers, each of said drivers comprising an input transistor and an output transistor driven by said input transistor, one of said drivers having an output transistor having an output electrode coupled directly to said conductor, another of said drivers having an output transistor having an output electrode coupled through a single one of said first diodes to said conductor, and a third of said drivers having an output transistor having an output electrode coupled through two of said first diodes to said conductor.

3. The communication circuit of claim 2, wherein at most one of said driver circuits is active at any one time.

4. The communication circuit of claim 2 wherein said transmitting means comprises first through third drivers, each of said first through third drivers comprising an input transistor and an output transistor coupled to be driven by said input transistor, the output transistor of said first driver having a collector connected directly to said single conductor, the output transistor of said second driver having a collector coupled through a single one of said first diodes to said conductor, and the output transistor of said third driver having a collector coupled through two of said first diodes to said conductor.

5. The communication circuit of claim 4, wherein said input multi-bit digital signal is a two-bit signal, said first and second drivers being coupled to operate in response to a first bit of said input multi-bit digital signal and said first and third drivers being coupled to be operated in response to a second bit of said input multi-bit digital signal.

6. The communication circuit of claim 2, wherein, said receiving means comprises a plurality of receiver circuits, each of said receiver circuits comprising at least one transistor having a control electrode connected in series with at least one of said second diodes, each of said diodes of each of said receivers having one electrode coupled to receive said multi-level signal.

7. The communication circuit of claim 6, further comprising means for combining outputs of said transistors of each of said receiver circuits to produce said output multi-bit digital signal.

8. The communication circuit of claim 6, wherein said receiving means comprises first through third receiver circuits, each of said receiver circuits comprising an input transistor and an output transistor coupled to be driven by said input transistor, said first receiver comprising one of said second diodes having a cathode coupled to said single conductor and an anode coupled to an input electrode of the input transistor of said first receiver, said second receiver comprising one of said second diodes having an anode coupled to said single conductor and a cathode coupled to an input electrode of the input transistor of said second receiver, and said third receiver comprising a series connection of two of said second diodes having a cathode coupled to said single conductor and an anode coupled to an input electrode of the input transistor of said third receiver.

9. The communication circuit of claim 8, wherein the input and output transistors of each of said receivers are coupled in a Darlington configuration.

10. A communication circuit for communicating a multi-bit digital signal between transmitting and receiving locations over a single conductor, comprising:

transmitting means at said transmitting location for producing a multi-level signal upon said conductor having a level determined in accordance with a state of an input multi-bit digital signal, said transmitting means comprising first through third drivers, each of said drivers comprising an input transistor and an output transistor coupled in a Darlington configuration, said first and second drivers being coupled to be operated in response to a first bit of said input multi-bit digital signal and said first and third drivers being coupled to be operated in response to a second bit of said input multi-bit digital signal, the output transistor of said first driver having a collector coupled directly to said single conductor, the output transistor of said second driver having a collector coupled through a single diode to said single conductor, and the output transistor of said third driver having a collector coupled through two diodes to said single conductor; and receiving means at said receiving location for producing an output multi-bit digital signal in response to said mutli-level signal and corresponding to said input multi-bit digital signal, said receiving means comprising first through third receivers, each of said receivers comprising an input transistor and an output transistor coupled in a Darlington configuration, said first receiver comprising a diode having a cathode coupled to said conductor and an anode coupled to a control electrode of the input transistor of said first receiver, said second receiver comprising a diode having an anode coupled to said single conductor and a cathode coupled to a control electrode of the input transistor of said second receiver, and said third receiver comprising two series-connected diodes having a cathode coupled to said single conductor and an anode coupled to a control electrode of the input transistor of said third receiver, said second receiver further comprising a control transistor having a control electrode coupled to an output electrode of the output transistor of said second receiver, a first signal electrode coupled to an output electrode of the output transistor of said first receiver and a second signal electrode coupled to a control electrode of the output transistor of said third receiver, said output multi-bit digital signal being produced at said output electrodes of said output transistors of said first and third receivers.

* * * * *